(12) United States Patent
Chen et al.

(10) Patent No.: US 8,116,149 B2
(45) Date of Patent: Feb. 14, 2012

(54) CIRCUIT AND METHOD FOR SMALL SWING MEMORY SIGNALS

(75) Inventors: Yi-Tzu Chen, Hsin-Chu (TW); Chia-Wei Su, Keelung (TW); Ming-Zhang Kuo, Xigang Shiang (TW); Chung-Cheng Chou, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 213 days.

(21) Appl. No.: 12/687,571

(22) Filed: Jan. 14, 2010

(65) Prior Publication Data

US 2010/0260002 A1 Oct. 14, 2010

Related U.S. Application Data

(60) Provisional application No. 61/169,087, filed on Apr. 14, 2009.

(51) Int. Cl.
*G11C 7/06* (2006.01)

(52) U.S. Cl. ......... 365/189.15; 365/189.16; 365/189.02; 365/190; 365/230.03

(58) Field of Classification Search ............ 365/230.03, 365/190, 189.02, 189.15, 189.16
See application file for complete search history.

(56) References Cited

U.S. PATENT DOCUMENTS

2010/0165749 A1* 7/2010 Wu et al. ............... 365/189.02

* cited by examiner

*Primary Examiner* — Andrew Q Tran
(74) *Attorney, Agent, or Firm* — Slater & Matsil, L.L.P.

(57) ABSTRACT

Circuits and methods for transmitting and receiving small swing differential voltage data to and from a memory are described. A plurality of memory cells is formed in arrays within a plurality of memory banks. Each memory bank is coupled to a pair of small swing differential voltage global bit lines that extend across the memory. A small signal write driver circuit is coupled to the global bit lines and configured to output a small signal differential voltage on the global bit lines during write cycles. A global sense amplifier is coupled to the global bit line pairs and configured to output a full swing voltage on a data line during a read cycle. Methods for providing small swing global bit line signals to memory cells are disclosed. The use of small swing differential voltage signals across the memory reduces power consumption and shortens memory cycle time.

20 Claims, 11 Drawing Sheets

| Per Din/Dout | Prior art | Invention | Improvement |
|---|---|---|---|
| Write speed(ps) | 290 | 263 | 9.31% |
| Read speed(ps) | 387 | 334 | 13.70% |
| Write current(uA) | 527.7 | 198.2 | 62.44% |
| Read current(uA) | 487.4 | 200.2 | 58.92% |

CIRCUIT AND METHOD FOR SMALL SWING MEMORY SIGNALS

This application claims the benefit of U.S. Provisional Application No. 61/169,087, entitled "Circuit and Method for Small Swing Memory Signals," filed on Apr. 14, 2009, which is incorporated herein by reference.

TECHNICAL FIELD

The present invention relates generally to semiconductor devices, and more particularly to a system and method for providing higher speed and lower power consumption in memory arrays disposed on integrated circuits fabricated on semiconductor devices.

BACKGROUND

Semiconductors are used in integrated circuits for a wide range of applications, including personal computers, music and/or video devices, multimedia devices, digital assistants, communications devices, and so forth. In general, integrated circuits include various circuits for providing user desired functionality. Increasingly, memory arrays, once manufactured as stand alone integrated circuits such as commodity DRAM or SRAM integrated circuits, are also being integrated on the same device as other circuitry. Embedded memory is increasingly used in application specific integrated circuits (ASICs) or system on a chip (SOC) integrated circuits. These highly integrated devices may include, without limitation, processors, microprocessors, digital signal processors, and memories for temporary and permanent storage, such as embedded dynamic RAM (DRAM), static RAM (SRAM) and non-volatile storage such as EEPROM and FLASH memory.

FIG. 1 depicts a typical prior art SRAM cell 10. Cell 10 is shown having 6 transistors M1-M6. In FIG. 1, a word line WL, sometimes referred to as a row line, is shown in a horizontal orientation. A word line will be arranged across multiple cells in a memory array. A pair of complementary bit lines BL and BL_ are shown oriented in columns or vertical arrangements. Note that FIG. 1 is a circuit schematic, that the word and bit lines as drawn are exemplary illustrations and that the row and bit lines may be arranged differently. The possible positions for the various devices and the orientations of the word and bit lines may be varied as is well known in the art, without changing the operation of the cell.

Six transistors are coupled to form each SRAM cell 10. Transistors M2 and M4, which are in this non-limiting example of P-type MOSFET pull up transistors, are coupled between two complementary storage nodes Q and Q_, respectively, and a positive supply voltage (VDD). VDD may be a typical positive supply voltage such as 5 volts or 3 volts, or more typically the memory core supply may be stepped down or lowered positive supply voltage, such as 2 volts, 1 volt, or slightly more or less. In some arrangements, the positive supply for the memory cells may be lower than positive supply voltages used in other circuits fabricated in the integrated circuit. As is known in the prior art, lowering VDD voltage level to the memory is often done as a method to conserve power and to speed the operation of the memory. In memory cell 10, transistors M1 and M3 are N-type MOSFET pull down transistors, and are coupled between the storage nodes Q_ and Q, respectively, and the ground reference voltage. The SRAM memory cell 10 is coupled as a cross-coupled latch, with one inverter formed by transistors M1 and M2 and another inverter formed by transistors M3 and M4. The inverter of M3 and M4 is coupled with the gates of transistors M1 and M2 coupled together and to the output of the inverter formed by transistors M3 and M4. Similarly, transistors M3 and M4 have their commonly coupled gates coupled to the output of the inverter formed by transistors M1 and M2.

In FIG. 1, access transistors (or transfer gates) M5 and M6 are coupled to transfer data from the storage nodes Q (M5) and Q_ (M6) to the complementary bit lines BL_ (M5) and BL (M6) when the word line WL is active.

During a "read" cycle, the bit lines (BL and BL_) may be pre-charged to a first voltage, and the word line WL may then become active. Assuming one of the storage nodes (Q and Q_) is at a low voltage, the other node is (since they are complementary) then at a high voltage, and one of the bit lines BL and BL_ will be pulled low when the access transistors couple the bit lines to the cell. Typically, the remaining bit line will remain at the pre-charged level although other arrangements are possible. Because the bit lines are arranged in complementary bit line pairs, a differential voltage sense amplifier may be used to receive the data from the memory cell by sensing a small differential voltage ($-\Delta V$) between the two bit lines for each bit line pair. The small signal differential sensing allows the sense amplifier to quickly determine the data value, without the need for one of the bit line pair to transition to a full "low" voltage level. The $\Delta V$ voltage may be, for example, 100 millivolts, 200 millivolts, or more or less. This voltage is placed on the bit line, in typical fashion, by lowering the bit line to a lower voltage when the cell is coupled to the bit line by the respective access transistor.

During a "write" cycle, the data to be stored in the SRAM cell will be placed on the bit line pair BL and BL_ prior to, or simultaneously with, the activation of the word line WL. This data will be a low level on one of the complementary pair, and thus one of the nodes Q and Q_ will be pulled down to a level low enough to override the stored data. The write voltages may be a Vdd voltage on one bit line, and the other bit line may be a lower voltage, typically around 0 volts or some similar low voltage.

FIG. 1 depicts only one memory cell 10. Typical SRAM arrays contain many thousands of such cells. These are often arranged in rows, with the word line or row lines running in a first direction and coupled to the gates of the cell access transistors (for example, M5 and M6 in FIG. 1) and the bit line pairs running in columns between the cells and coupled to the source/drain terminals of the cell access transistors. Note that the terms "row" and "column" are used herein in the circuit schematic sense, and for convenience only, in describing the cells and the word and bit lines. Memory array layout arrangements known in the prior art include folded bit lines, and a variety of other layout arrangements where bit lines and word lines are orthogonal, are parallel, or arranged in various other directions with respect to each other. In a simple case for explanatory purposes as described here, the layout will also have columnar bit lines and word lines arranged in another direction, typically horizontal and perpendicular to the columns of bit line pairs, but this is not a necessary element of a memory as meant herein and the terms "row" and "column" do not limit the various arrangements that are contemplated herein.

The memory arrays of the prior art typically include a local sense amplifier coupled to each of the bit line pairs of a segment of the array. The local sense amplifier may be a differential sensing amplifier that can sense a small voltage difference $\Delta V$ between the bit lines BL and BL_, and by amplification of the sensed small signal, form a larger voltage swing signal for transmission on a global bit line pair. Sensing of small differential voltages has several advantages. The time needed for the memory cell in a read operation to place a small differential voltage on one of the bit lines (with respect to the complementary bit line, typically set at a nominal pre-charge value such as Vdd or Vdd/2) is very short when compared to the time needed to pull the same bit line to a low voltage such as zero volts. The use of small swing differential voltages on local bit lines also enables the sensing operation to quickly sense the small voltage $\Delta V$, and to start outputting amplified full level voltages on the global bit lines.

FIG. 2 depicts in a block diagram a typical memory arrangement 20 of the prior art. In FIG. 2, memory 20 is formed using, for example, a plurality of the SRAM cells 10 of FIG. 1 to form a memory array. In FIG. 2, each memory bank 21 of the N memory banks, including Bank_0 to Bank_N−1, comprise an array 25 of many hundreds or thousands of memory cells 10. Each array 25 has memory cells (such as, for example, cell 10 in FIG. 1) disposed at intersections of the rows and columns of array 25. The word lines (row lines) are not shown in the diagram for simplicity. A plurality of local bit line pairs 24 are arranged in columns shown vertically in the diagram. A column multiplexer (mux) 23 is provided. Using selection circuitry, mux 23 chooses a subset of the bit lines pairs 24 for a given memory access cycle to form a word width wide set of bit lines for the access. For example, if the data word width is 16 bits (0-15) in an example memory, the global bit line pairs will form 16 columns. The memory array itself may have, for example, 256 columns (16 sets of 16) arranged across the array and in this simple example, the column mux 23 will select 16 out of 256 bit line columns at a given time for a memory access, which may be a write or a read cycle. Many memories have larger arrays such as 1,024 columns, 2,048 columns, etc. and the embodiments herein are not limited by these examples.

The local bit line pairs 24 are also coupled through the column mux 23 to a write driver and local sense amplifier block 27. Block 27 provides several functions. The write driver and local sense amplifier 27 couples the global bit line pairs GBL/GBLB to the selected local bit lines. The local bit lines are typically small swing signals which will have one line at a full Vdd voltage, and a second line at a small differential voltage $\Delta V$ below Vdd, say −0.3 Volts or −0.2 Volts or similar. The global bit lines are full swing signals so that the sense amplifier senses, for a memory read, the differential voltage $\Delta V$ between the local bit line pair and amplifies that voltage using a known sense amplifier circuit to a full swing output voltage (Vdd for a "1" and zero volts for a "0", or vice versa) on the global bit line pair GBL/GBLB. The block 27 may contain a local sense amplifier for each bit in the memory word width, so if there are 16 bits in the word width, there will be 16 global bit line pairs, and corresponding to each one of the pairs, 16 local sense amplifiers in block 27.

Block 27 in FIG. 2 must also provide write data to the local bit lines 24 from the global bit line pairs during a write cycle. The column mux 23 then will place these signals onto the appropriate pair of local bit lines BL/BL_ and that write data will then override the data stored in any of the active cells selected by the word line. To speed memory access cycles, fast page mode or sequential accessing may be done where the address decoders include, for example, incrementing circuits for providing faster accesses to sequential or blocks of locations.

Each bank of the memory 20, banks Bank_0-Bank_N−1 in FIG. 2, contains identical circuitry arranged across a plurality of global bit line pair columns. The memory may be further subdivided into sectors so that as the loads on the global bit lines increase, additional current or drive capacity may be needed to speed the signal transitions. A sector Din/Dout buffer 29 may provide additional drive strength to compensate for the large capacitive loading on the global bit line pairs. The memory 20 needs to be coupled to a data bus for outputting data and receiving write data from other circuitry. An input/output data block 31 provides buffers for driving data out and receiving input data to the memory.

As the size of the memory embedded into or fabricated in integrated circuits increases, the length and loading on the global bit lines GBL/GBLB also increases. The prior art global bit lines are full swing signals, and the need to transition these large signal lines from a low voltage level to a high voltage level on such a heavily loaded buss slows memory accesses for both read and write cycles. The need to drive the heavily loaded and increasingly long global bit lines requires additional drivers or buffers or increasing the size of existing drivers or buffers, increasing the power consumed by the memory.

FIGS. 3a and 3b depict exemplary pie charts representing the power consumed by the memory arrangements of the prior art, for example as shown in FIG. 2. In FIG. 3a, the power consumed during a write cycle is shown for portions of a typical memory implemented in a current semiconductor process technology. The cell power consumption is represented by the current used during the write in the memory cells, iwe_cell. This represents about 19% of the power consumed. The decoder power consumption is represented by the current used during the write by the decoder functions, iwe_xdec, which represent about 9% of the power consumption. The remainder of the power used during the write cycle (labeled iew_io) is attributed to the input and output circuitry including the global bit lines, and the buffers and write drivers. This represents about 72% of the power consumed. Similarly, FIG. 3b depicts the power consumed by a prior art memory device sections during a typical read cycle. As these pie charts illustrate, most of the power consumed is being used in the input/output portion of the memory array, including the bit line wiring and connections. Because power consumption by memory elements in integrated circuits is one area of power that needs reduction, particularly for integrated circuit applications that are battery powered such as cell phones, portable audio and video players, portable computers, PDAs and the like, a continuing need exists to provide memory devices that consume less power and provide faster access times.

SUMMARY OF THE INVENTION

These and other problems are generally solved or circumvented, and technical advantages are generally achieved, by embodiments of a system and a method for characterizing process variations.

In accordance with an embodiment, a memory circuit is provided, comprising a plurality of memory banks arranged in an array, each memory bank comprising memory cells in rows and columns, and each having word lines configured to enable access transistors within the memory cells to couple data to and from a pair of complementary local bit lines, each memory bank further comprising a local sense amplifier for sensing small swing voltages on the local bit lines and for sensing small swing voltages on a pair of complementary global bit lines. The plurality of the global bit lines is arranged in pairs of complementary bit line signals, the global bit lines extending across the memory array and coupled to the local sense amplifier in each of the memory banks. A write small signal driver circuit is provided and coupled to full swing input/output data lines and operable to output complementary small swing signals on the plurality of global bit lines. A global sense amplifier is also coupled to the plurality of global bit lines and configured to sense the small swing differential signals on the global bit lines, and having full swing output signals.

In another embodiment, an integrated circuit is provided, comprising integrated circuitry disposed on a substrate, the integrated circuitry configured to perform defined operations; and at least one memory, comprising a plurality of memory banks, each memory bank having a read small signal circuit coupled to output a small swing differential voltage signal on a pair of complementary global bit lines. The complementary global bit lines are coupled extending across the memory and coupled to each of the memory banks and to a write small signal driver circuit operable to provide small signal differential voltages on the global bit line pairs responsive to full swing input data. A global sense amplifier is coupled to the pair of complementary global bit lines for receiving the small swing differential voltage signals and operable to output full swing voltage data output signals.

Further method embodiments and alternative circuit and system embodiments are described. In accordance with another embodiment, a method is provided for transmitting and receiving data to and from memory cells, comprising coupling a plurality of memory arrays to a pair of small signal voltage differential global bit lines that extend across the memory; providing a small signal write driver for receiving data to be written to the memory during a write cycle, and configured to output a small signal differential voltage on the small signal voltage differential global bit lines; providing a global sense amplifier coupled to the small signal swing voltage differential global bit line pair configured to output a full swing voltage complementary pair of data lines during a read cycle; and providing an input/output circuit for coupling the memory to a data buss carrying full logic level signals.

An advantage of an embodiment is that by using small swing signal differential voltages on the global bit lines extending across a memory device, the time needed to perform a write cycle in the memory and a read cycle in the memory is reduced.

A further advantage of an embodiment is that by reducing the amount of signal swing needed to provide signals on the global bit lines of a memory device, the current consumed during a read cycle and during a write cycle is reduced.

Yet another advantage of an embodiment is that by using small swing signal differential voltages on the global bit lines extending across a memory device, both the power consumed during operations and the cycle time required for operations of a memory device are improved over memories of the prior art.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments and the advantages thereof, reference is now made to the following descriptions taken in conjunction with the accompanying drawings, in which.

The drawings are presented as illustrative and are examples presented for illustrative purposes, are not limiting, and are not drawn to scale.

DETAILED DESCRIPTION

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a memory device. The memory device can be any memory containing cells where local bit line pairs and local sense amplifiers are used including, as non-limiting examples, DRAM, SRAM, flash and other memory cell types. In the particular embodiments described as illustrative examples herein, an SRAM memory is described. The embodiments may be applied to any memory device formed on a semiconductor substrate, including discrete or standalone memory devices and the embodiments are of particular applicability to embedded memories for use in forming ASIC or SOC integrated circuits, including embedded memory portions to form a single chip function such as a cellphone transceiver, processor, or the like. However, the embodiments are not limited to any particular memory or application.

Figure 4:
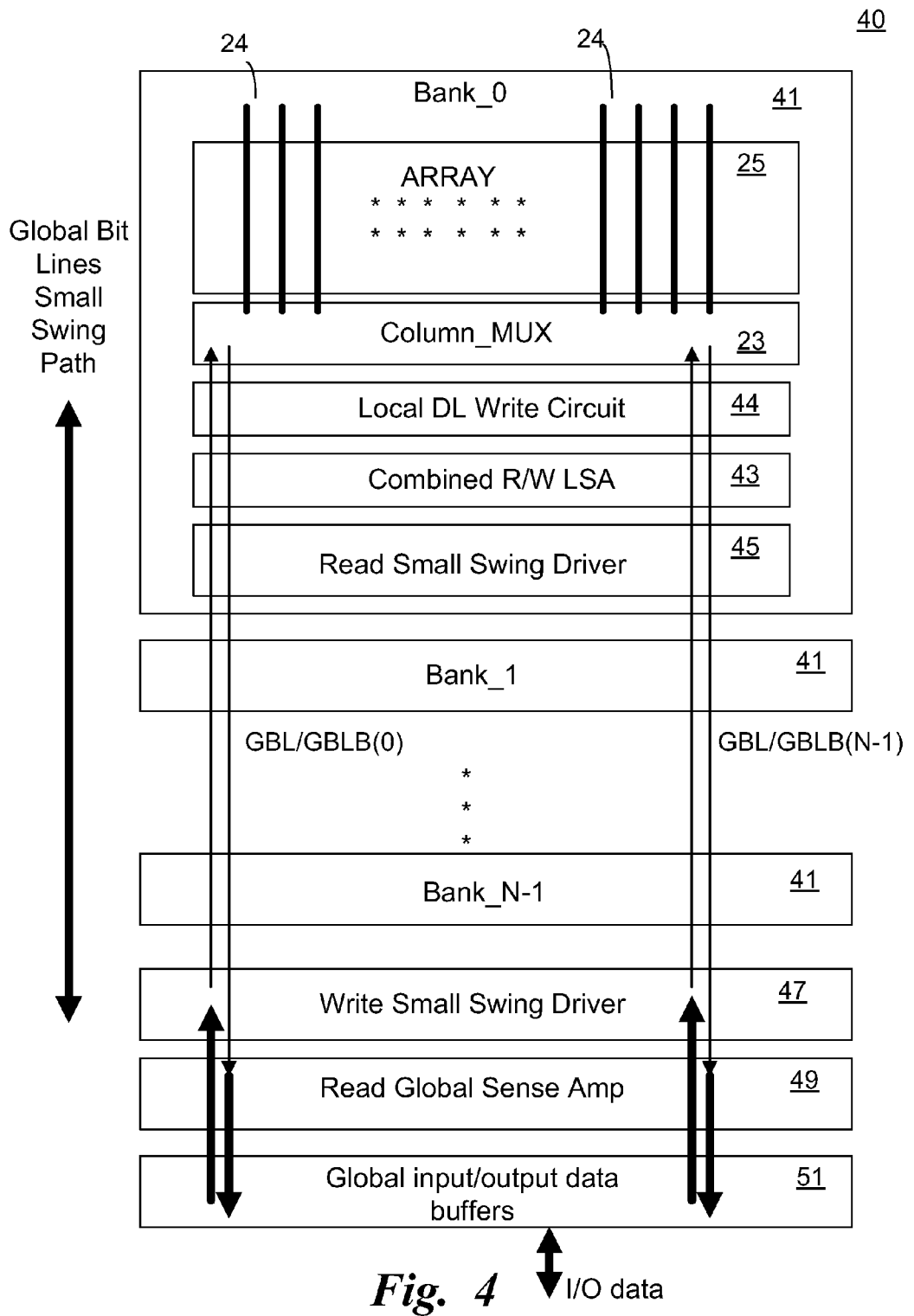
FIG. 4 is a block diagram of an embodiment of an improved memory device incorporating features of the present invention.

FIG. 4 depicts in a block diagram a memory embodiment 40 incorporating features of the present invention. In memory 40, memory banks Bank_0-Bank_N−1 each numbered 41 are shown. Some of the elements of the memory embodiment presented here are the same as in the prior art memory 20 depicted in FIG. 2 and for those common elements, the same reference numerals are shown. For example, in Bank_0, array 25 is the same as in FIG. 2 and may comprise hundreds or thousands of memory cells. Each of these memory cells is disposed at the intersection of a word line (not shown) and a local bit line pair 24 as before. Column multiplexer 23 is unchanged from FIG. 2 and the multiplexer again provides selection of a word of a predetermined width from a number of columns of local bit line pairs, from a greater number of total bit line pairs 24, such as 16 out of 256, or 64 out of 1024, etc. A combined read/write local sense amplifier circuit (labeled Combined R/W LSA) 43 is provided in each memory bank 41. This local sense amplifier is further coupled to read small swing driver circuit 45 and, a local DL write circuit 44.

The global bit lines GBL/GBLB(0 . . . N−1) are now coupled as small swing voltage differential signal pairs. Thus, the read small swing driver 45 in each memory bank 41 outputs, during a read cycle, a small swing voltage signal on each of the global bit line pairs GBL/GBLB. The combined R/W local sense amplifier 43 in each memory bank receives a small swing signal, and for a write cycle, outputs a similar small swing voltage signal on local data line pairs coupled to the column mux 23, which places the data on the bit line pairs 24 selected for access in the current memory cycle. For a read cycle, the combined R/W local sense amplifier 43 receives the small swing data from the selected row of cells, and outputs this sensed data to the read small swing driver 45.

The global bit lines GBL/GBLB in FIG. 4 are coupled to each of the N memory banks 41, Bank_0 . . . Bank_N−1. Each of these N memory banks contains the same functional blocks 25, 23, 43, and 45 shown in Bank_0 in FIG. 4.

Because the global bit lines GBL/GBLB in FIG. 4 are now small swing differential voltage signals, and because the I/O data of the memory 40 are full swing logic level voltage signals, the memory 40 needs additional circuitry to level translate the small swing signals on the global bit lines to the single ended, full logic level data buss (labeled I/O data) coupled at the input/output of the memory 40.

For write cycles, a full logic level signal on a pair of I/O signals I/O and I/O_ must be converted to the small swing differential voltage signals. These signals are to be placed on the global bit line pairs GBL/GBLB. Write small swing driver circuit 47 provides this function. Write small signal driver 47 is coupled to receive the data from the I/O bit line pairs I/O and I/O_, one such pair for each bit in the word width. This write circuit block performs a signal level translation from the full swing at the inputs to the small swing signals on the global bit line pairs.

Similarly, the data coming from the memory cells onto the global bit lines from a cell selected during a read cycle, the data to be output from the memory 40, should be converted from the small swing differential voltage on the global bit lines GBL/GBLB to the full logic levels needed on the I/O data buss pairs I/O and I/O_. Block 49, labeled "Read Global Sense Amp" provides a sense amplifier for receiving small swing differential voltage signals from the global bit line pairs and for outputting full logic level signals. Finally, the global input/output data buffers in block 51 translate the differential paired I/O signals used in the memory to the single ended data signals needed at the I/O data bus.

Figure 5:
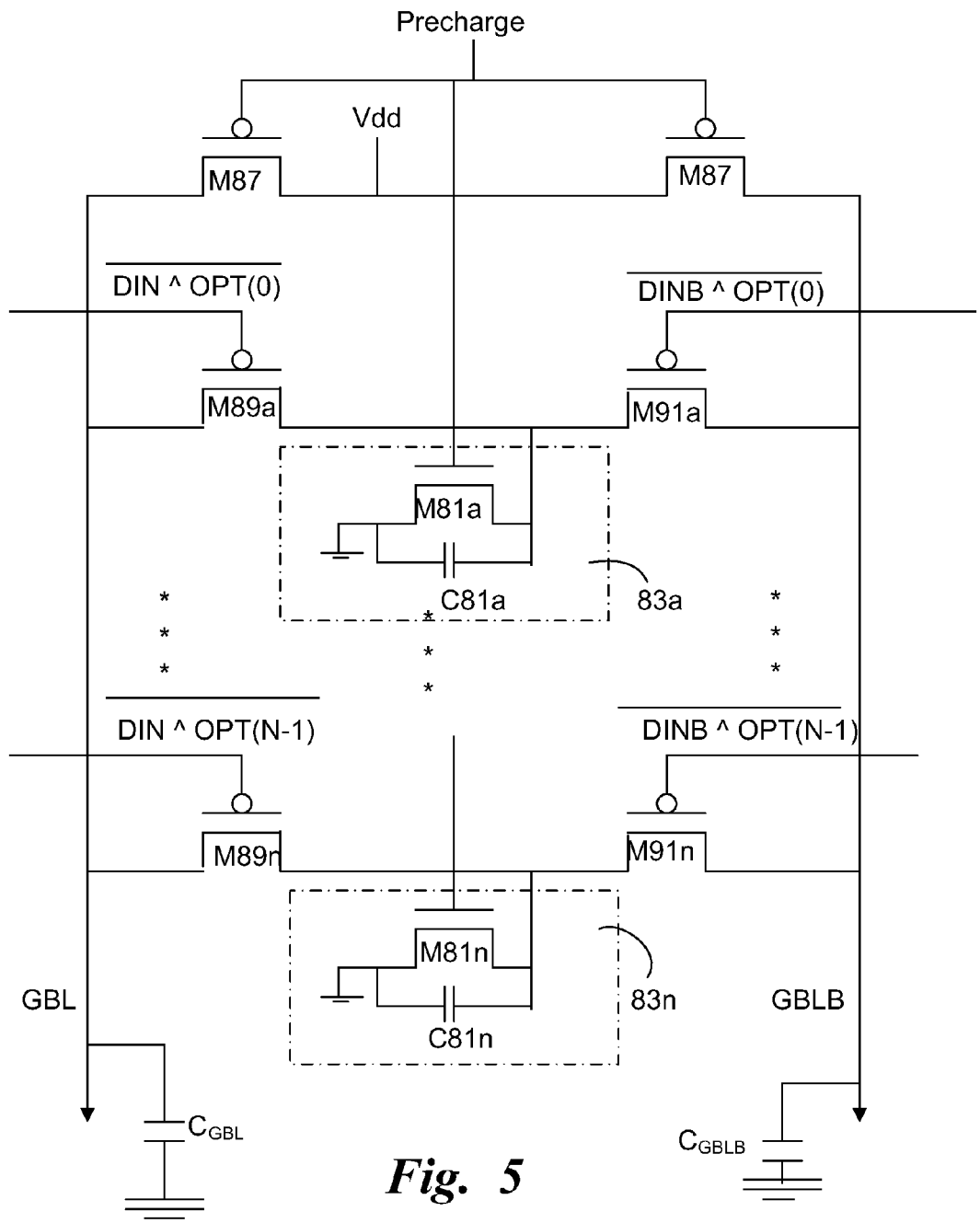
FIG. 5 is a circuit schematic of a small signal write driver circuit embodiment used in FIG. 4.

FIG. 5 depicts an exemplary embodiment for write small swing driver 47. In FIG. 5, a control signal OPT (0-N−1) is used to selectively set the magnitude of the small signal differential voltage $\Delta V$ that is used to form the low level voltage, Vdd-$\Delta V$, placed on one of the global bit lines GBL/GBLB in a write cycle. Driver 47 has a plurality of N capacitor and transistor pairs, each formed of a transistor M81$a$ . . . n and capacitor C81$a$ . . . n. Each of these pairs is coupled to either the global bit line GBL or the global bit line bar GBLB during a write cycle. The selection of the bit line is determined by the write data DIN or DINB. If DIN is a low voltage (usually representing a "0") then, for example, transistor M89$a$ will couple the pull down stages 83 to the global bit line GBL. If DINB is a low voltage, then for example transistor M91$a$ will couple the GBLB line to a low voltage.

The number of pull down states 83 is selected, in this exemplary embodiment, by the values for the OPT field OPT (0_N−1). Each bit of the OPT input can selectively add a pull down stage 83 so as to increase the magnitude of the small signal differential voltage $\Delta V$. The global bit lines GBL and GBLB will then be set at voltages VDD and VDD-$\Delta V$, respectively, depending on the value of the data inputs DIN and DINB, for a given write cycle.

The operation of the write small swing driver circuit is as follows:
Pre-charge state: GBL=GBLB=VDD; all capacitors C81$a$-$n$ discharged by transistors M81$a$-$n$
Write Data 1: (DIN=1, DINB=0), GBL=VDD, GBLB=VDD--$\Delta V$
Write Data 0: (DIN=0, DINB=1), GBL=VDD---$\Delta V$, GBLB=VDD To determine the number of stages needed to achieve the differential charge sharing voltage −$\Delta V$, the following expressions may be used. Using the charge equation for capacitors, Q=CV, and then noting that since the charge sharing operation conserves charge, an expression can be given:

$$VDD*C_{GBL}=(C0+C1+Cn-1)*V_x+CGBLB*V_x;$$

that is, the total available charge CV is the same before and after the charge sharing that lowers the voltage level on the selected global bit line. Here voltage $V_x$=VDD×$\Delta V$, Assuming all capacitors C81$a$ . . . C81$n$ are the same value C1, then, $$VDD*C_{GBL}=N*C1*V_x+C_{GBL}*V_x.$$

Solving this expression for $\Delta V$ gives: $\Delta V$=VDD/1+($C_{GBL}$/N*C1).
Setting VDD to an example value of 1.0 Volts and, assuming the maximum $\Delta V$=100 millivolts, a relationship N*C1=0.1111$C_{GBL}$ is obtained.
Using these values, a 5 stage (selected by OPT (0:4)) write small signal driver circuit gives for 5 different selections on OPT:

| | N | | | | |
|---|---|---|---|---|---|
| | 1 | 2 | 3 | 4 | 5 |
| $\Delta V$ | 20 mV | 40 mV | 60 mV | 80 mV | 100 mV |

So in one embodiment, a programmable differential voltage value, a write small signal driver circuit can be provided by using the exemplary circuit embodiments of FIG. 5. The $\Delta V$ value can be determined by the OPT signal selecting from N stages. Alternatively, by using known circuit simulation techniques, a designer may determine the desired differential voltage $\Delta V$ needed and provide only the required number of stages 83$a$ . . . n for a given process node. This simulation would be done using the capacitor values for C1 and the global bit line capacitors. In this alternative embodiment, the circuit could be implemented with a fixed number of pull down stages 83 and no selection field OPT would be needed for the circuit. Pre-charge transistors M87 will place a known voltage on the bit lines.

Figure 6:
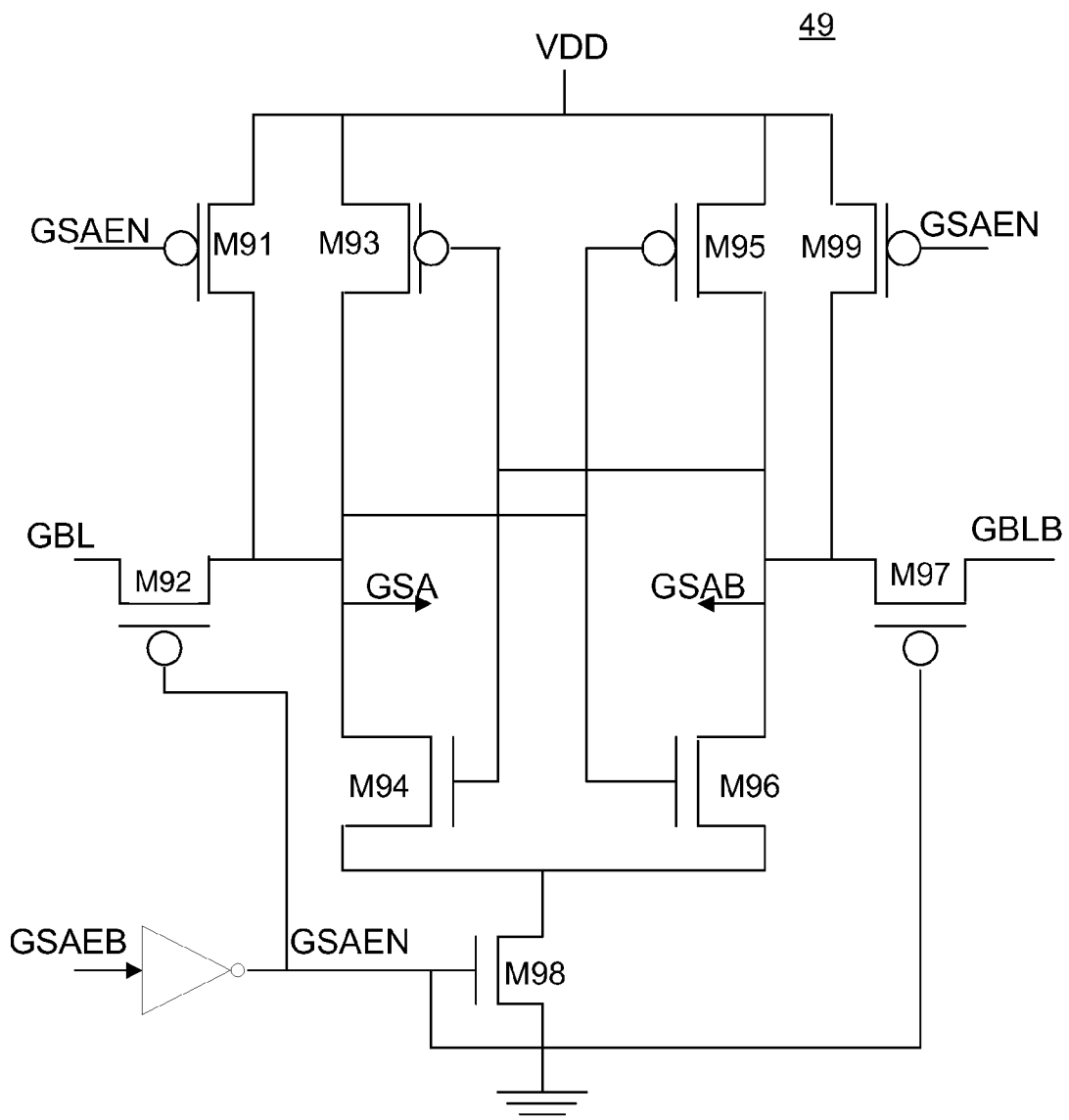
FIG. 6 is a circuit schematic of an embodiment of a sense amplifier used in FIG. 4.

In addition to the write small swing driver 47, circuitry is provided for coupling the single ended, full logic level signals at the I/O buss in FIG. 4 to receive read data from the small swing differential signals on the global bit lines. Read global sense amplifier 49 is depicted in FIG. 6. Sense amplifier 49 is a cross coupled latch of inverters. Transistors M93, M94, M95, and M96 are provided to sense and latch the small signal differential voltage on the inputs GBL and GBLB onto the outputs GSA and GSAB, which are full swing logic level voltage signals. Enable signal GSAEB provides the enable ground connection by controlling the NMOS FET M98. The transfer gates or access transistors M92 and M97 receive the global bit lines GBL/GBLB as inputs. These transfer gates allow the read data on those global bit lines to be sensed by the sense amplifier 49.

M91 and M99 are pre-charge transistors to equalize the node voltages in the GBL&GSA, and another GBLB&GSAB. In pre-charge state, the signals GBL=GBLB=VDD and GSA=GSAB=VDD. In Read '0': GBL=VDD-$\Delta$V so that GSA=VDD-$\Delta$V but GBLB=GSAB=VDD, while In Read '1': GBLB=VDD-$\Delta$V so that GSAB=VDD-$\Delta$V, but in contrast, GBL=GSA=VDD.

Figure 7:
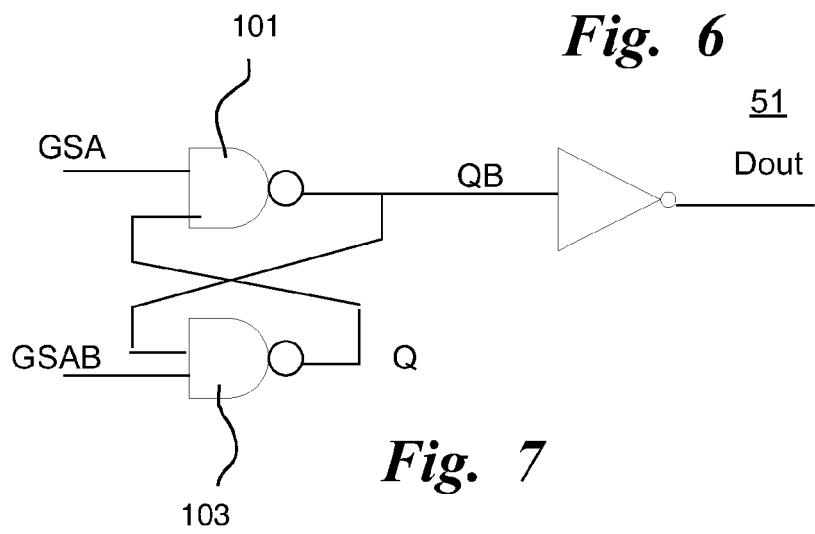
FIG. 7 is a circuit schematic of an embodiment of a data output latch circuit used in FIG. 4.

In FIG. 7, the data output circuit 51 is shown. This cross coupled latch converts the differential, full swing logic level signals from the global sense amplifier 49, GSA and GSAB, to a single ended data output signal Dout. The NAND gates 101 and 103 are cross coupled as a latch but may be overwritten by a "0" on an input GSA, GSAB to latch a new value. For example, if Dout is initially a "1", then QB is a "0", which means that Q is a "1", so GSA is a "1". GSAB is a "0" since it is complementary to GSA. If GSA then changes to a "0", and GSAB being complementary becomes a "1", then Q will become a "0" as the NAND of two "1"s, and QB will become a "1", and Dout will then transition to a "0". All of these operations are known to those skilled in the art, the circuit could be arranged differently as an alternative to the exemplary embodiment illustrated here. The circuit needs to receive a differential pair of signals and output a single ended data output, but latches other than the NAND gates could be used and are contemplated as alternatives.

Figure 8:
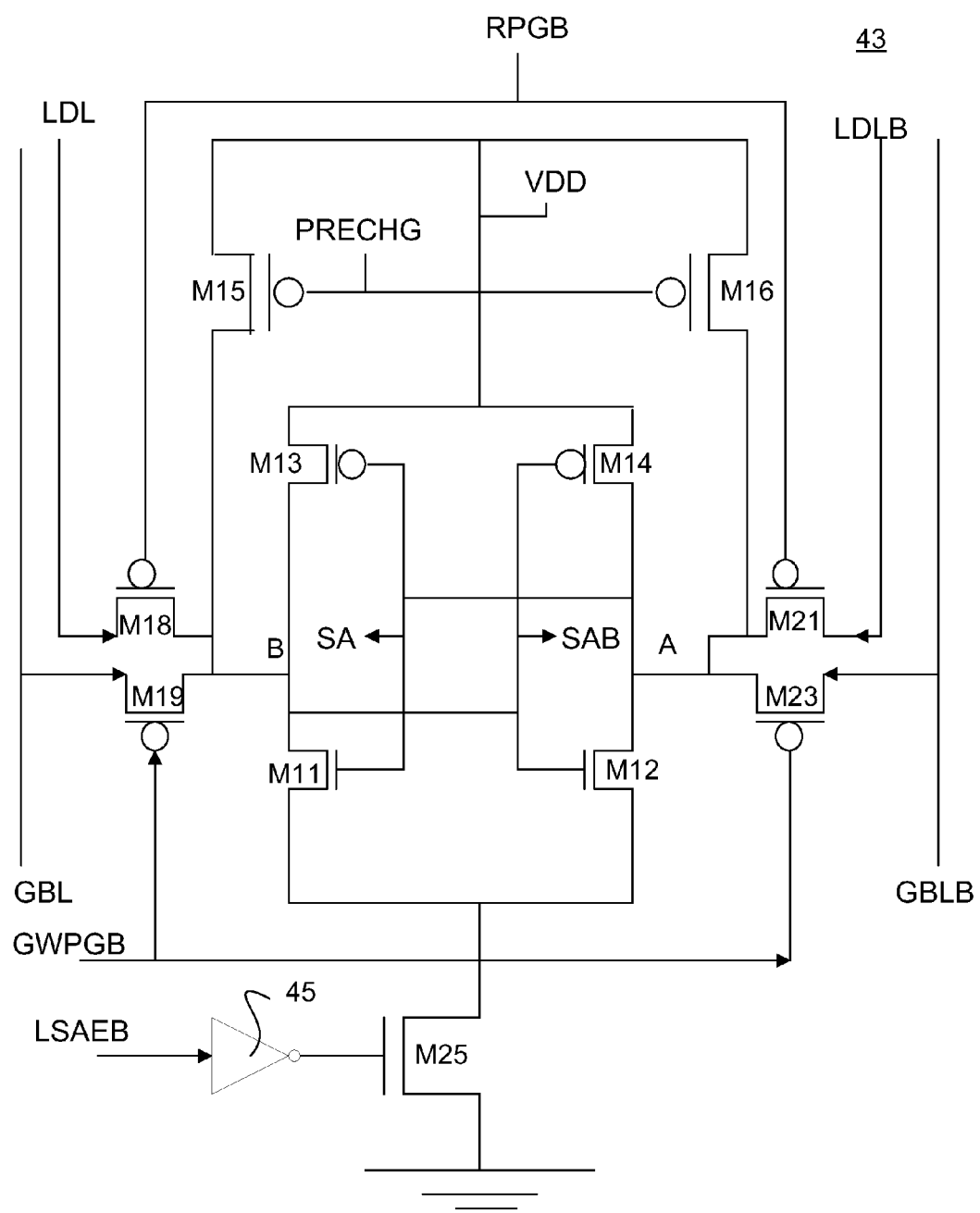
FIG. 8 is a circuit diagram of a local sense amplifier embodiment used in FIG. 4.

FIG. 8 depicts an exemplary embodiment for the combined local R/W sense amp 43 used in each of the memory banks Bank_0 . . . BankN–1. The sense amplifier 43 has two pairs of inputs. When the control line RPGB is active (low), the local data buss LDL and its complement LDLB are coupled as inputs to nodes B and A by the pass gate transistors M18 and M21, respectively. In another function, when the control line global write program bar (GWPGB) is active low, the transistors M19 and M23 couple the global bit lines GBL and the complement GBLB, respectively, to the nodes B and A in the sense amp.

The local sense amplifier 43 further comprises pre-charge transistors M15 and M16, and enable transistor M25, which enables current to flow, or prevents it from flowing by breaking the ground voltage connection in response to the LSAEB (local sense amplifier enable bar) input. The cross coupled latch of N MOSFET transistors M11 and M12 and P MOSFET transistors M13 and M14 is then able to receive data from either of the local data lines LDL and LDLB from the column mux 23 (not shown) or from the global data line pairs GBL and GBLB, depending on whether the operation in a particular cycle is a read (in which case, a signal on control line RPGB will select the local data lines) or a write (in which case, a signal on control line GWPGB will select the global bit lines).

Sense amplifier 43 begins a memory cycle with a pre-charge of the nodes A and B. The pre-charge is controlled by input signal PRECHG. When PRECHG is active (low), it couples a voltage such as VDD to the nodes A and B and thus to the sense amplifier outputs SA (coupled to A) and SAB (coupled to B).

In a read memory cycle, the pre-charge is followed by the local sense amplifier enable signal LSAEB going active. A low signal on this input enables transistor M25 (due to the inverter 45), and an RPGB signal enables input PMOS transistors M18 and M21 (which act as transfer gates). These transfer gates input the data received from the column mux 23 on the local data lines (LDL and LDLB) into nodes B and A. Assuming one of the local data lines is below Vdd by the small swing differential signal $\Delta$V, the pull up PMOS FET (either M13 or M14) coupled to that lower node will begin turning on, and as it does so, the NMOS FET on the other side of the cross coupled latch will also turn on, therefore nodes SA and SAB will transition in opposite directions to latch the input data.

Similarly, in a memory write cycle, the control line GSPGB will become active (active low, in this example embodiment) and the transistors M19 and M23 will act as input transfer gates and nodes A and B will receive the data that is on the global bit lines GBL and GBLB. One of the nodes A and B will therefore be pulled down to the low level voltage VDD-$\Delta$V. The sense amplifier nodes SA and SAB will then cause the other node to rise, and the sense amplifier will latch the high and low level data signals for use by other circuits.

Figure 9:
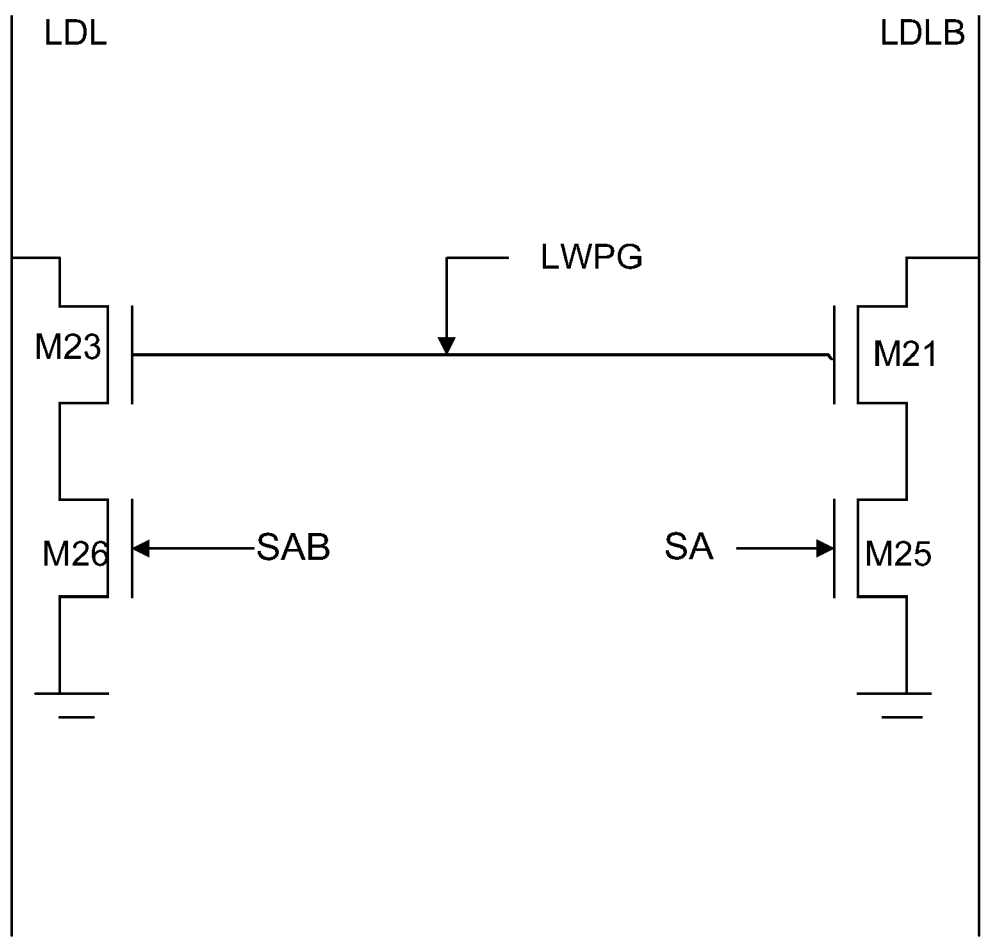
FIG. 9 is a circuit diagram of a local write driver embodiment.

FIG. 9 depicts local write circuit 44, which receives the output of the local R/W sense amplifier 43 on nodes SA and SAB as inputs, and which outputs the data values on the local data lines LDLB and LDL responsive to control input signal LWPG. When SAB is a "1", pull down transistor M26, an N MOSFET in the exemplary circuit arrangement of FIG. 6, will pull down local data line LDL to a low value of approximately zero volts. Similarly, and conversely, when node SA is a "1", pull down transistor M25 will pull down the local data line bar complementary signal LDLB to a low value. The data on the local complementary pair signals LDL and LDLB will be coupled through the column mux 23 to the selected bit line pairs in a column in the array 25 and then onto the selected row of memory cells. When control line LWPG is not active, then transistors M23 and M21 ensure the local data lines are not disturbed by the write circuit, e.g. this circuit is inoperative during a memory read cycle.

Figure 10:
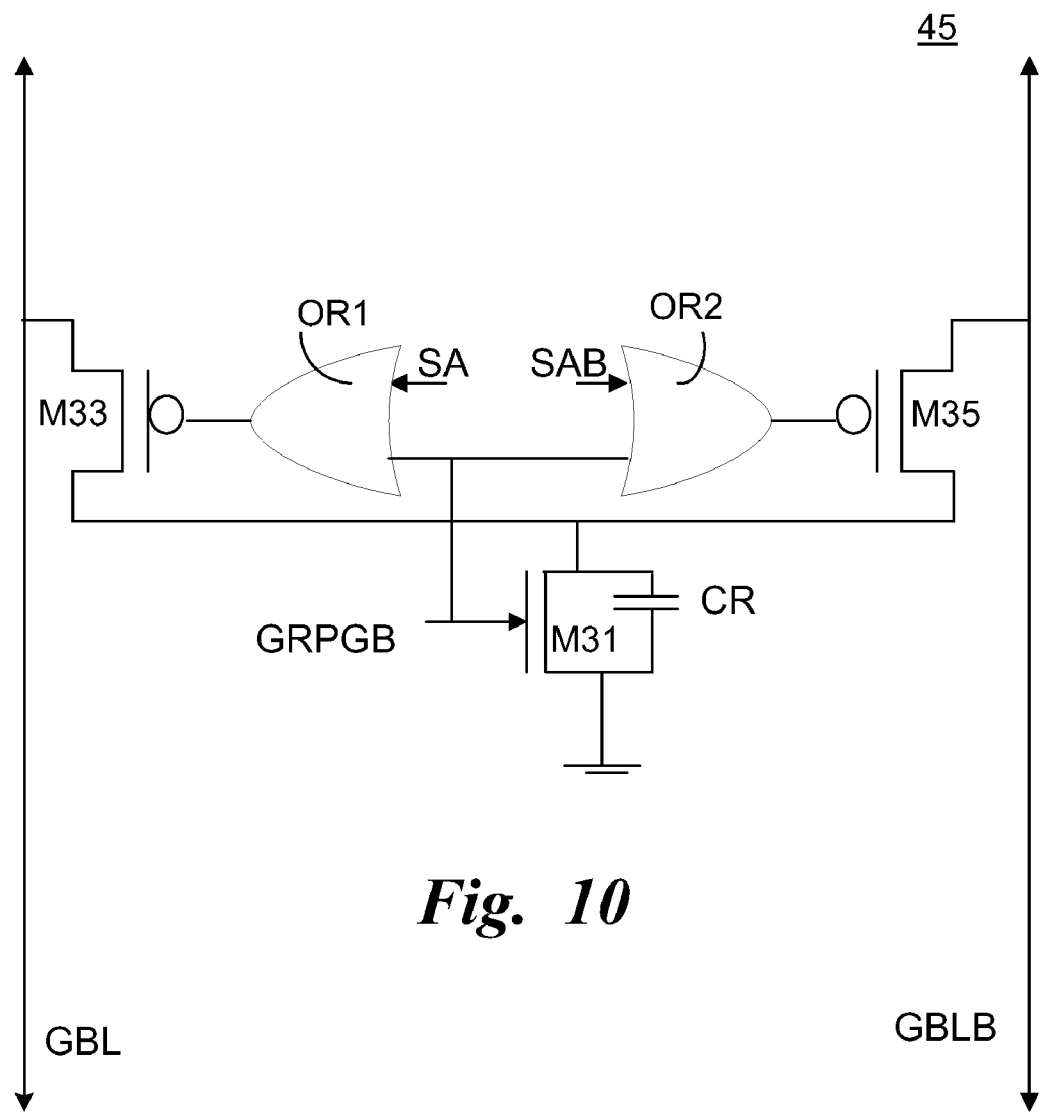
FIG. 10 is a circuit diagram of small signal read circuit embodiment.

FIG. 10 depicts an exemplary implementation of the small signal read driver circuit 45 in FIG. 4. The signals SA and SAB in memory read cycles are placed on the small swing differential signal complementary global bit line pair GBL and GBLB. The OR gates OR1 and OR2 will disable the PMOS transfer gates M33 and M35 when the control signal GRPGB is a "1". When the signal is a "1", transistor M31 also discharges capacitor CR by coupling it to ground. When the control signal is a "1", the circuit is not active, that is, it is not a memory read access cycle.

In contrast, when the control signal GRPGB is a low or "0" value, the two OR gates OR1 and OR2 will act as inverter control signals on the gates of transfer transistor M33 and M35. When node SA is a "1", the output of OR1 is a "1", so transistor M33 is inactive and the global bit line GBL remains at a pre-charged voltage ("1"). When, for example, node SA is a "0" and the signal GRPGB is also a "0", the OR gate OR1 outputs a zero, turning on transfer gate M33. Due to charge sharing as is known in the art, the voltage on the bit line, in this example GBL, will charge capacitor CR and thus the voltage will fall by the small signal voltage $\Delta$V. Thus, the small signal voltages on the global bit lines will be a high voltage such as Vdd and a slightly lower voltage, such as Vdd-$\Delta$V. This smaller voltage might be, for example, 100 millivolts when Vdd is 1.0 Volts. Other $\Delta$V voltages may be used so long as they are large enough to cause the various sense circuits to be able to latch the opposing data values. Larger $\Delta$V voltages provide greater noise margin and reliability but slow the memory cycle, as compared to smaller ones. A design tradeoff is then made to determine how small the small signal differential voltage may be, while maintaining robust operations and noise immunity within the memory. The corresponding operation of the circuit in FIG. 10 occurs on global bit line GBLB when the node SAB is a "0". The capacitor CR value then will determine, for the local data lines, the magnitude of ΔV. Although shown as a single capacitor, an arrangement similar to that of FIG. 5 could be used to program this voltage or a plurality of parallel capacitors could be used, for example, to increase CR.

Figure 11A:
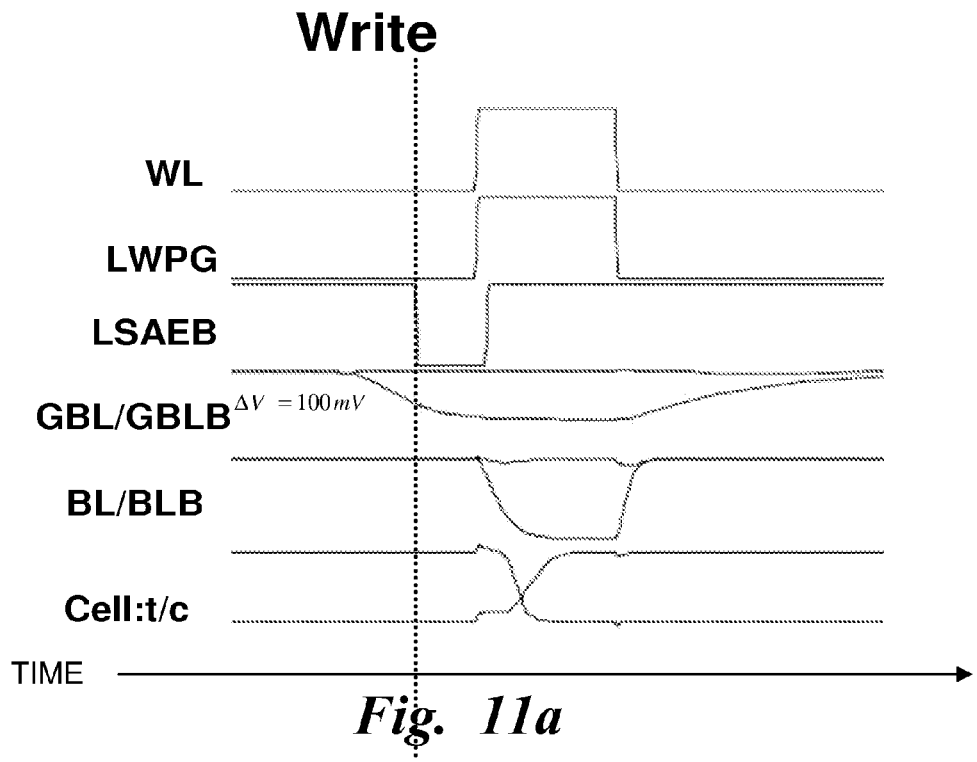
FIG. 11a is a timing diagram of a memory write cycle for a memory embodiment.
Figure 11B:
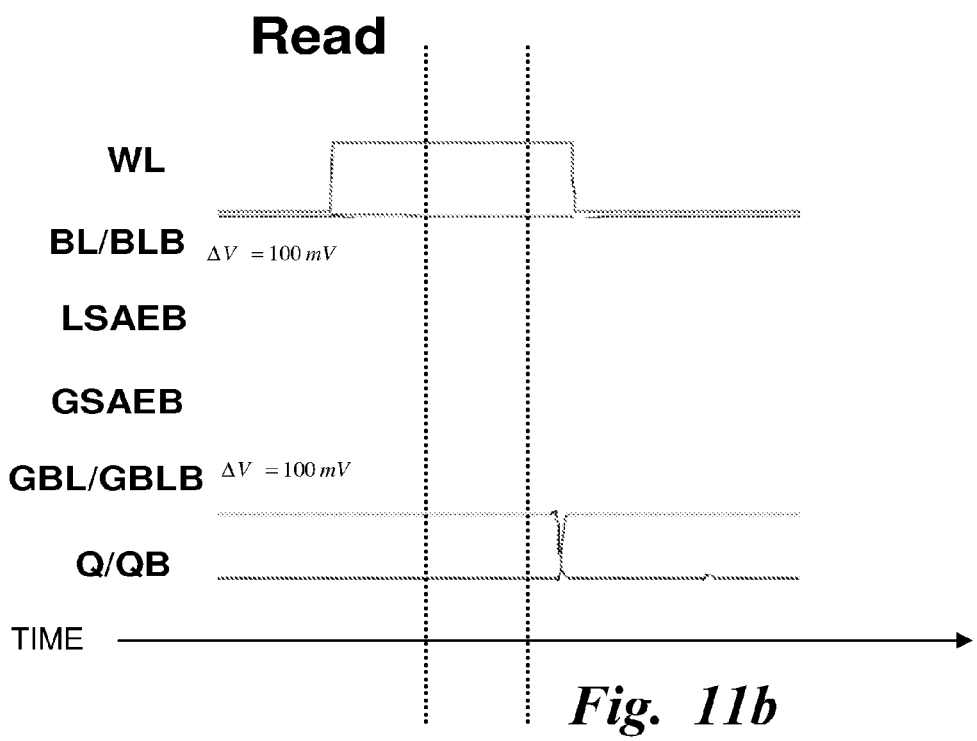
FIG. 11b is a timing diagram of a memory read cycle for a memory embodiment.

The use of the small swing voltage global bit lines in memory 40 is illustrated in a read and write timing diagram in FIGS. 11a and 11b, respectively. In FIG. 11a a write cycle is depicted. The write begins with the global bit line pair GBL/GBLB, initially at a pre-charged value of "1". As the write data appears on the global bit lines, the lines begin diverging to a data value where one of the two lines is at the "0" voltage of VDDAV. The write to the arrays in the selected memory bank begins when the local sense amplifier enable bar signal LSAEB transitions from an initial high voltage to a low voltage. This causes the local sensing operation to begin, when the local write control signal LWPG transitions to a high voltage, the local bit lines BL/BLB being diverged from an initial pre-charged condition to a condition where one of the lines swings to a low voltage. The word line WL goes high and selects the row of memory cells to be written at the same time the LWPG signal goes high, and the transition of the cell contents Cell t/c occurs as the local bit lines diverge.

In FIG. 11b, the timing of a read cycle using the embodiment of FIG. 4 is depicted. In this timing diagram, the read cycle begins when the word line WL transitions to a high value, enabling the selected SRAM cell to place data out on the local bit lines BL/BLB. The local bit lines diverge to a value VDD and VDD-ΔV. By using a small swing differential voltage signal for the read, the timing is improved at the array level. The local sense amplifier control signal LSAEB then falls, enabling the local sense amplifier to couple the local data busses to the global bit lines GBL/GBLB, which in turn enables these busses to begin falling to values VDD and VDD-ΔV. The cycle continues when the control line for the global sense amplifier GSAEB falls, enabling the global sense amplifier to receive the small swing signal differential voltage on the global bit lines and couple it to the output data latch, where it is then latched as a full swing signal Q/QB.

The use of the embodiments of the present invention enable a memory array to be formed that provides faster timing and conserves power over memory arrays of the prior art. By providing a small swing differential voltage global bit line pair that extends over the memory, the amount of current needed, and time required to provide read and write data to and from the input/output buffers of the memory is reduced. The circuits and methods are compatible with existing circuits and semiconductor processes and no additional process steps are required to take advantage of the embodiments.

Figure 1:
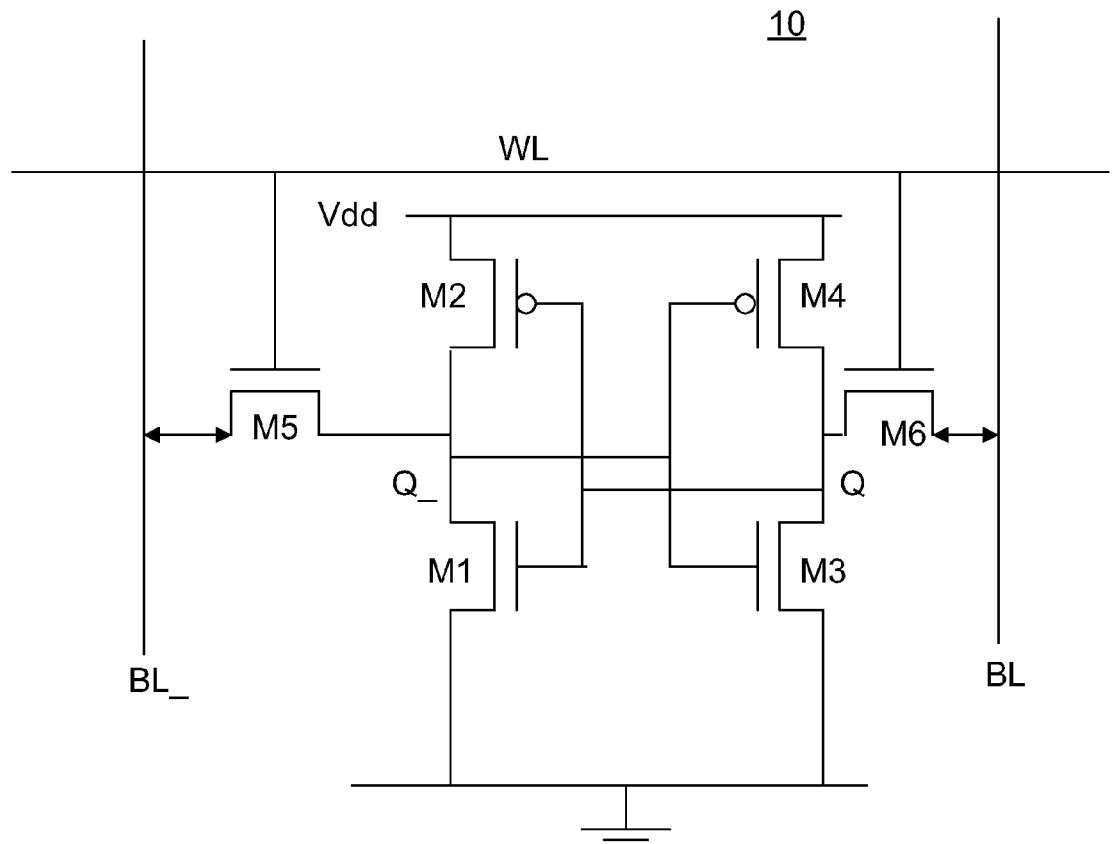
FIG. 1 is a diagram of a prior art memory cell.
Figure 2:
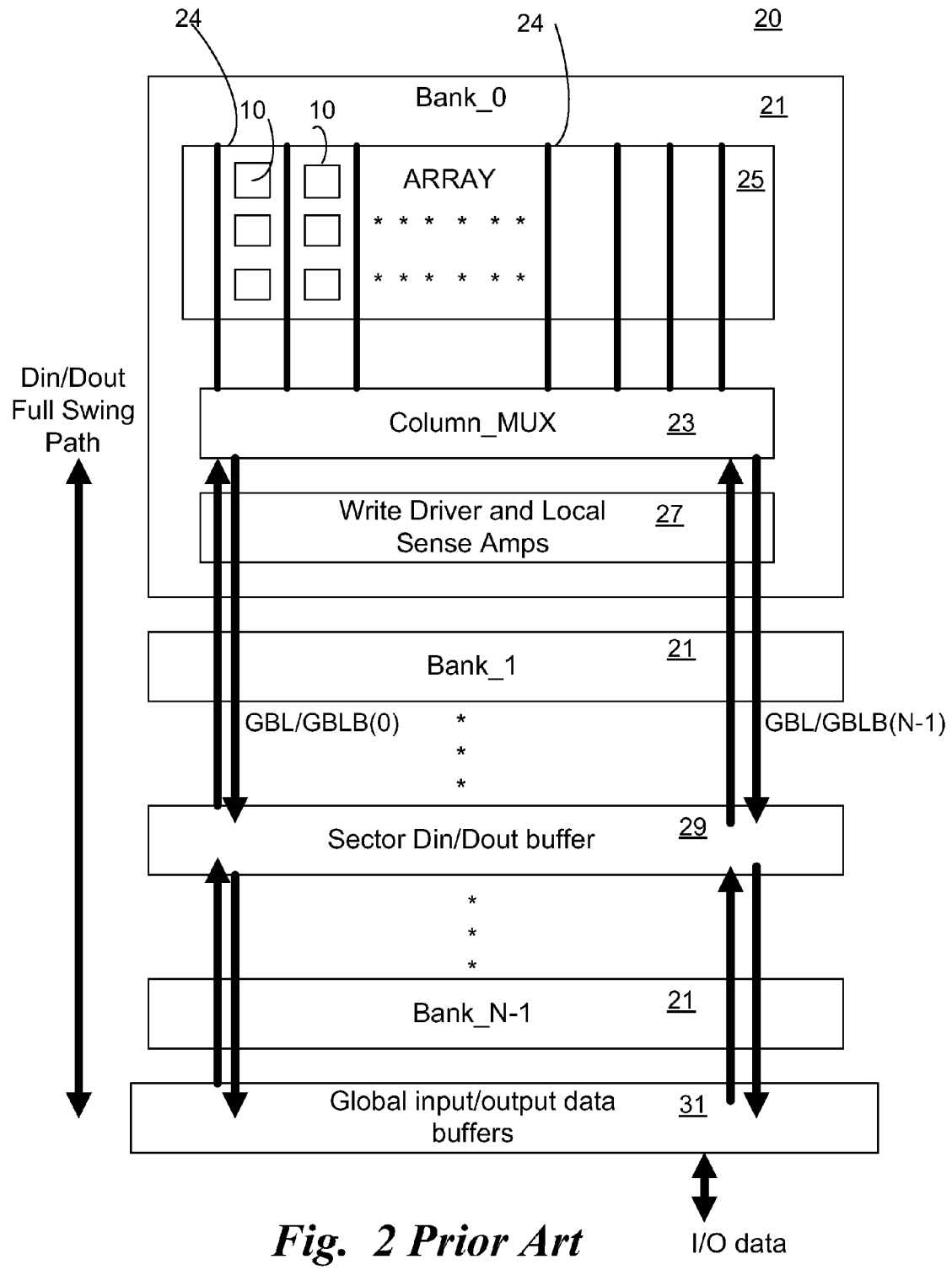
FIG. 2 is a block diagram of a prior art memory device.
Figure 3A:
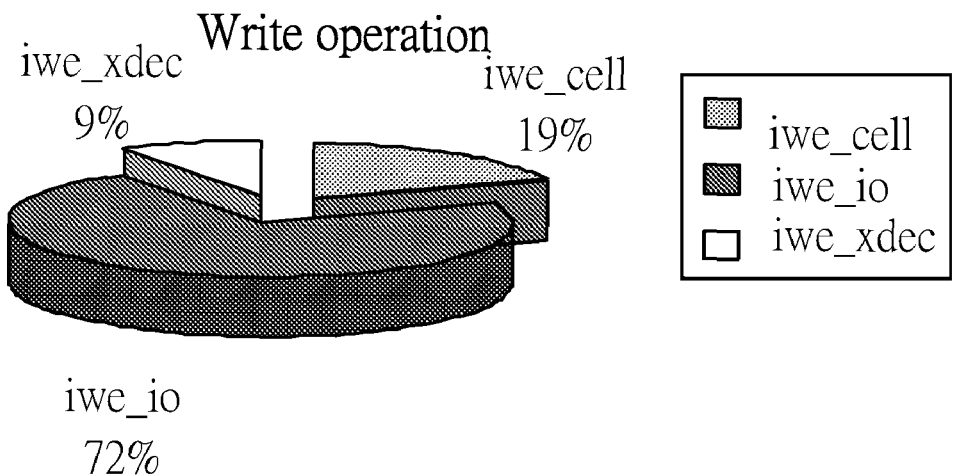
FIG. 3a is a pie chart illustrating the current used in a write operation in a prior art memory device.
Figure 3B:
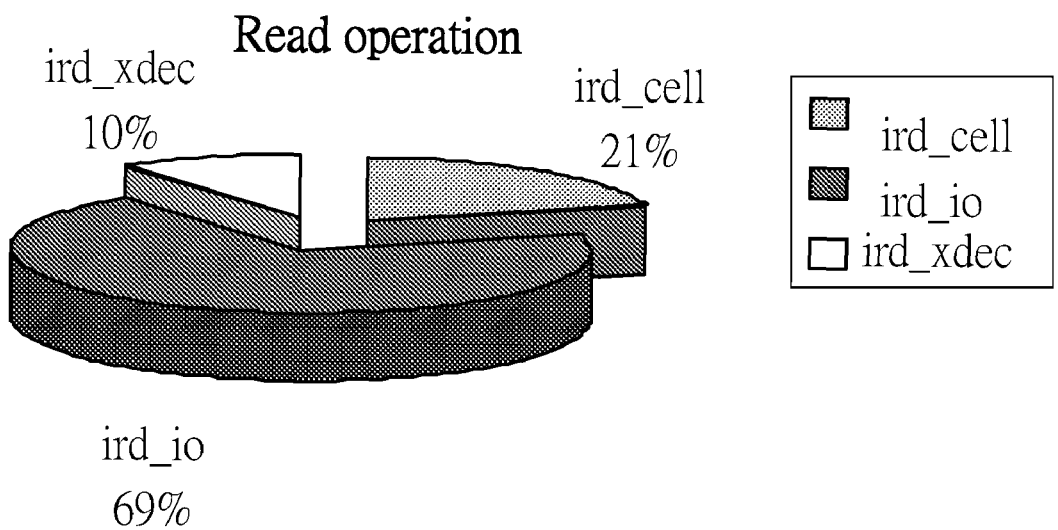
FIG. 3b is a pie chart illustrating the current used in a read operation in a prior art memory device.
Figures 12, 13:
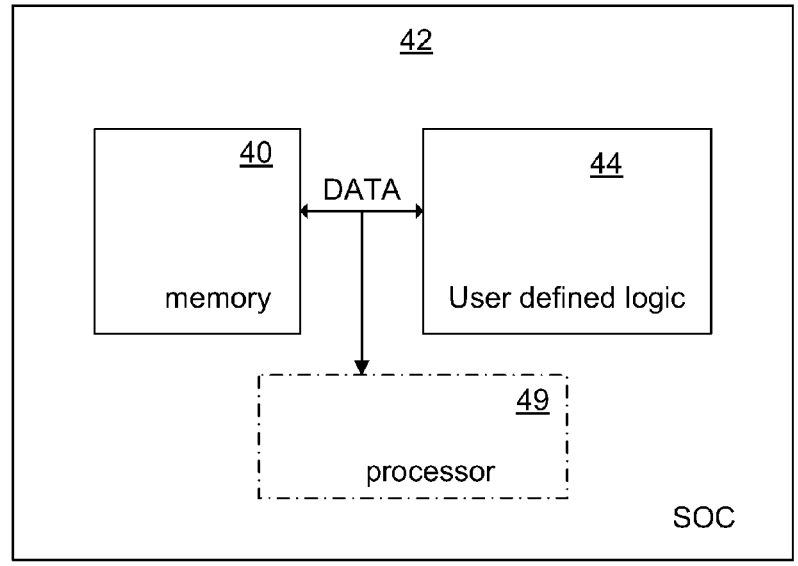
FIG. 12 is a table comparing simulation results of a prior art memory and an embodiment memory incorporating features of the present invention.
FIG. 13 is a block diagram of an integrated circuit incorporating a memory embodiment of the present invention.

FIG. 12 presents simulation results obtained for a memory incorporating the circuit embodiments described above when fabricated in a current technology semiconductor process. In FIG. 12, a table compares the results for a prior art memory such as depicted in FIG. 2, in the same process, with the results obtained for the embodiment illustrated in FIG. 4. In FIG. 12, the first row describes the write speed in picoseconds. For the prior art memory, the speed achieved at 105 degrees C. for a typical 40 nanometer process node, with VDD at 1.0V, was 290 picoseconds. For an embodiment incorporating the features of the invention, the same temperature, VDD and process parameters were used and the result obtained was 263 picoseconds, a 9.31% improvement over the prior art. Similarly for the read, the result obtained for the read cycle in the prior art memory was 387 picoseconds. The results for a memory incorporating the embodiments of the invention were 334 picoseconds, a 13.70% improvement.

The current consumed by the memory incorporating the embodiments was also improved. In FIG. 12, the write current was improved by 62.44%. The read current was improved by 58.92%. Thus, in sharp contrast to other prior attempts to speed up memory access times, less current was consumed by the faster memory incorporating the embodiments of the invention. This reduction in current consumption was achieved without sacrificing performance, and in fact, access performance actually improved.

The advantages of the arrangement of the embodiment of FIG. 4 over the prior art accrue because for the entire length of the memory, with the exception of blocks 47, 49 and 51 which may lie adjacent the boundary of the memory, the signals transmitted and received on the global bit line pairs are small swing differential voltage signals. Because the signals to be developed by a driver such as the write small swing driver 47 for writes, or the read small swing driver 45 for the output of each memory bank, need only develop a small differential voltage ΔV, the timing of the memory cycles can be faster than for the prior art, and simultaneously the current consumed within the memory in the I/O and driver portions of the memory will be substantially less than for the prior art memory, for example, as depicted in FIG. 2.

FIG. 13 depicts the advantageous use of a memory incorporating the small swing differential voltage signals on the global bit lines in a system on a chip (SOC) integrated circuit 42. Memory 40 may be, as described above, an embedded SRAM, embedded DRAM or other memory with sense amplifiers used to sense small signal differential voltage signals. User defined logic 44 may be logic circuitry, including without limitation and as examples only, mixed signal circuitry such as analog to digital converters, digital to analog converters, analog front end circuits or the like and may include additional embedded memory circuits. An SOC also often includes a known processor supplied as a licensed "IP core" design, such as a RISC, DSP, or micro-processor function. This element 49 is shown dashed, as it may not be used in a particular SOC. These functions share a common data buss DATA with memory 40, so that memory 40 can store data, instructions, predetermined vectors, coding tables, and the like for retrieval by the remaining functions. Alternatively, memory devices that are stand alone integrated circuits may be fabricated and, using the embodiments of the present invention, achieve lower power consumption and faster access times than prior art memory integrated circuits.

Although the embodiments of the invention, and exemplary illustrations thereof and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory circuit comprising:
   a plurality of memory banks arranged in an array, each memory bank comprising memory cells in rows and columns, and each having word lines configured to enable access transistors within the memory cells to couple data to and from a pair of complementary local bit lines, each memory bank further comprising a local sense amplifier for sensing small swing voltages on the local bit lines and for sensing small swing voltages on a pair of complementary global bit lines;
   a plurality of the global bit lines arranged in pairs of complementary bit line signals, the global bit lines extending across the memory array and coupled to the local sense amplifier in each of the memory banks;
   a write small signal driver circuit coupled to full swing input/output data lines and operable to output complementary small swing signals on the plurality of global bit lines; and
   a global sense amplifier coupled to the plurality of global bit lines and configured to sense small swing differential signals on the global bit lines, and having full swing output signals.

2. The memory circuit of claim 1, wherein the memory receives full logic level I/O signals that are coupled to the write small swing driver circuit during memory write cycles and is operable to store corresponding data in selected ones of the memory cells, and wherein the memory is operable during a read cycle to output full logic level I/O signals corresponding to data stored in selected ones of the memory cells.

3. The memory circuit of claim 1, wherein the memory cells are static RAM cells.

4. The memory circuit of claim 1, wherein the memory cells are dynamic RAM cells.

5. The memory circuit of claim 1, wherein the memory cells are non-volatile cells.

6. The memory circuit of claim 1, wherein the write small signal driver circuit further comprises:
   a first plurality of access transistors coupled to a first full swing data input signal, and each coupled to one of a group of select signals;
   a second plurality of access transistors, each having a control input coupled to a corresponding complementary full swing data input signal and to the one of the group of select signals, and each operable to couple one line of a pair complementary global bit lines to the write small signal driver circuit; and
   a plurality of charge sharing capacitor stages, each coupled to each one of the first plurality of access transistors and to the corresponding one of the second plurality of access transistors, configured to share charge and thereby lower a voltage on a selected one of the global bit lines by a small differential voltage;
   whereby selecting the number of charge sharing capacitor stages determines the magnitude of the small signal differential voltage that will be placed on one of the pair of complementary global bit lines.

7. The memory circuit of claim 1, wherein each of the memory banks further comprises:
   a local data line write circuit coupled to the global data bit lines and operable to place a low voltage on one of the local data lines, responsive to the outputs of the local sense amplifier.

8. The memory circuit of claim 7 wherein the local data line write circuit is enabled during a memory write cycle.

9. The memory circuit of claim 1, wherein each of the memory banks further comprises a read small signal driver circuit having outputs coupled to the pair of complementary global bit lines and operable to place a small signal differential voltage on one of the complementary global bit lines responsive to the output of the local sense amplifier.

10. The memory circuit of claim 9 wherein the read small signal driver is enabled during a memory read cycle.

11. The memory circuit of claim 1 wherein each of the memory banks further comprises a column multiplexer operable to couple the local data lines to a selected group of the local bit lines, responsive to control signals.

12. An integrated circuit comprising:
    integrated circuitry disposed on a substrate, the integrated circuitry configured to perform defined operations; and
    at least one memory, comprising:
       a plurality of memory banks, each memory bank having a read small signal circuit coupled to output a small swing differential voltage signal on a pair of complementary global bit lines;
       the complementary global bit lines extending across the memory and coupled to each of the memory banks and to a write small signal driver circuit operable to provide small signal differential voltages on the global bit line pairs responsive to full swing input data; and
       a global sense amplifier coupled to the pair of complementary global bit lines for receiving the small swing differential voltage signals and operable to output full swing voltage data output signals.

13. The integrated circuit of claim 12 wherein the memory comprises memory banks, each further comprising:
    an array of memory cells arranged in rows and columns;
    a plurality of word lines arranged along the rows and each coupled to the gates of access transistors of a row of the memory cells;
    a plurality of local bit lines arranged along the columns in pairs of complementary local bit lines operable to carry a small swing differential voltage signal; and
    a local sense amplifier coupled to each pair of local bit lines and operable to sense the small swing differential voltage signal on the local bit lines.

14. The integrated circuit of claim 13 wherein the memory cells are static RAM cells.

15. The integrated circuit of claim 12 wherein the write small signal driver circuit further comprises:
    a plurality of first access transistors coupled between the global bit line and a plurality of charge sharing stages for lowering a pre-charged voltage on the global bit line by a small signal differential voltage, responsive to a data input signal and a selection signal;
    a plurality of second access transistors coupled between the complementary global bit line and the plurality of charge sharing stages for lowering a pre-charged voltage on the complementary global bit line by a small signal differential voltage, responsive to a complementary data input signal and the selection signal; and
    control circuitry for selecting the number of charge sharing stages to be used to set the small signal differential voltage to a predetermined voltage.

16. The integrated circuit of claim 15 wherein the pre-charged voltage is a Vdd voltage.

17. The integrated circuit of claim 15 wherein the small signal differential voltage is greater than 10 millivolts.

18. The integrated circuit of claim 15 wherein the small signal differential voltage is greater than 100 millivolts.

19. A method for transmitting and receiving data to and from memory cells, comprising:
- coupling a plurality of memory arrays, each comprising a plurality of memory cells, to a pair of small signal voltage differential global bit lines that extend across the memory;
- providing a small signal write driver for receiving data to be written to the memory during a write cycle, and configured to output a small signal differential voltage on the small signal voltage differential global bit lines;
- providing a global sense amplifier coupled to the small signal swing voltage differential global bit line pair configured to output a full swing voltage complementary pair of data lines during a read cycle; and
- providing an input/output circuit for coupling the memory to a data buss carrying full logic level signals.

20. The method of claim 19, wherein coupling a plurality of memory arrays to a pair of small signal voltage differential global bit lines that extend across the memory further comprises:
- providing for each memory bank an array of memory cells arranged in rows and columns;
- coupling word lines arranged along the rows to access transistors in each memory cell, the access transistors configured to couple the memory cell to a pair of complementary local bit lines responsive to the word lines;
- coupling local sense amplifiers to each pair of complementary local bit lines for sensing small swing differential voltage signals on the local bit lines during a read cycle; and
- coupling each of the local sense amplifiers to each pair of global bit lines for sensing small swing differential voltage signals on the global bit lines during a write cycle.

* * * * *